United States Patent [19]
Padmanabhan

[11] Patent Number: 5,702,957
[45] Date of Patent: Dec. 30, 1997

[54] METHOD OF MAKING BURIED METALLIZATION STRUCTURE

[75] Inventor: Gobi R. Padmanabhan, Sunnyvale, Calif.

[73] Assignee: LSI Logic Corporation, Milpitas, Calif.

[21] Appl. No.: 710,783

[22] Filed: Sep. 20, 1996

[51] Int. Cl.$^6$ ............................................. H01L 21/265
[52] U.S. Cl. ............................................. 437/24; 437/194
[58] Field of Search ............................... 437/24, 26, 43, 437/63, 69, 143, 195, 197, 200, 245, 194

[56] References Cited

U.S. PATENT DOCUMENTS

| | | | |
|---|---|---|---|
| 3,622,382 | 11/1971 | Brack et al. | 117/201 |
| 4,295,898 | 10/1981 | Yoshida et al. | 148/1.5 |
| 4,374,392 | 2/1983 | Reichert | 357/23 |
| 4,683,637 | 8/1987 | Varker et al. | 437/63 |
| 4,700,454 | 10/1987 | Baerg et al. | 437/24 |
| 4,975,126 | 12/1990 | Margail et al. | 145/33.2 |
| 5,025,304 | 6/1991 | Reisman et al. | 357/71 |
| 5,077,225 | 12/1991 | Lee | 437/24 |
| 5,102,826 | 4/1992 | Ohshima et al. | 437/200 |
| 5,168,078 | 12/1992 | Reisman et al. | 437/195 |
| 5,278,077 | 1/1994 | Nakato | 437/24 |
| 5,315,144 | 5/1994 | Cherne | 257/351 |
| 5,534,446 | 7/1996 | Tachimori et al. | 437/26 |
| 5,565,371 | 10/1996 | Gill | 437/43 |
| 5,567,629 | 10/1996 | Kubo | 437/24 |
| 5,567,635 | 10/1996 | Acovic et al. | 437/43 |

FOREIGN PATENT DOCUMENTS

| | | |
|---|---|---|
| 3726842 | 2/1988 | Germany. |
| 60-170975 | 9/1985 | Japan. |
| 2-128430 | 5/1990 | Japan. |

*Primary Examiner*—John Niebling
*Assistant Examiner*—Michael S. Lebentritt
*Attorney, Agent, or Firm*—Hickman Beyer & Weaver, LLP

[57] ABSTRACT

Disclosed is an IC structure providing conductive lines for routing within a semiconductor substrate immediately below the level of the active IC devices. These "buried" conductive lines are insulated from each other by dielectric regions formed as an insulating plane immediately below the active devices and resembling a conventional silicon on insulator (SOI) structure. Within this plane, however, the buried conductive lines provide routes between various active device elements to form some circuit connections such as intracell connections for a gate array. Thus, the buried conductive lines replace some routing from the metallization/dielectric layer stack on top of the active region.

16 Claims, 6 Drawing Sheets

METHOD OF MAKING BURIED METALLIZATION STRUCTURE

BACKGROUND OF THE INVENTION

The present invention relates to integrated circuits having a conductive line provided below a semiconductor surface to electrically interconnect active devices at the semiconductor surface. The invention also relates to processes for fabricating integrated circuits having such conductive lines.

Most conventional integrated circuit (IC) fabrication processes can be divided into "front end" steps and "back end" steps. Front end steps generally include those steps necessary to form the actual transistor elements such as source/drain regions, gates, and isolation regions. Back end steps generally include those process steps necessary to create circuitry by wiring the various transistors formed by the front end processing. The circuitry created in the back end steps includes complicated line routing patterns that are provided as conductive vertical interconnects between transistors at the IC substrate level and metallization layers sitting in a layered stack above the substrate. Dielectric layers electrically insulate the metallization layers from one another and from the substrate. Each such metallization layer is patterned to form various metal lines that electrically link device elements from multiple transistors and thereby form the IC's circuitry.

It is not uncommon for gate arrays and other back end intensive ICs to require five or more metallization layers for carrying out the necessary routing. Unfortunately, each additional metallization layer adds significantly to the cost and complexity of fabricating the gate array. For many reasons, it is often undesirable to stack up more and more metallization layers as ICs become more complex.

Much of the routing in any gate array design functions to define the relatively small individual circuits that make up the IC. Such circuits are commonly formed on a single base cell of a gate array and may be simple logic circuits such as NAND gates as well as more complex circuitry such as multiplexers and flip flops with multiple inputs. The interconnections required to form such single cell circuits are referred to herein as "intracell" routing. In addition to such basic circuit-level routing, ICs also employ a certain amount of "chip-level routing" or "intercell" routing which connects the various circuits together to form a functioning IC. Such chip-level routing is made up of metallization lines that may have to cross many base cells. To the extent that circuit-level intracell routing occupies space on a given metallization level, that space is unavailable for intercell routing. In fact, if the intracell routing occupies too much space it may be necessary to employ another metallization layer for some or all of the chip-level routing. Thus, gate array designs that reduce the amount of circuit-level routing at the first and second metallization levels can significantly reduce the cost of an IC.

In view of the above example, it would be desirable to provide an IC design that reduces the amount of intracell routing and frees up some space for intercell routing. More generally, it would be desirable to find alternatives to metallization layer interconnections for providing the wiring necessary to form IC circuitry.

SUMMARY OF THE INVENTION

The present invention provides "buried" conductive lines for routing within a semiconductor substrate at a level where active IC devices are formed. Preferably, these buried conductive lines are provided immediately below the active devices and are insulated from each other by dielectric regions. To effectively insulate, the dielectric regions should be provided at the same depth as the buried conductive lines. In some regards, the ICs of this invention may resemble a conventional silicon on insulator (SOI) structure in that a dielectric layer is provided as an insulating plane immediately below the active devices. Within this plane, however, the buried conductive lines provide routes between various active device elements to form some circuit connections. Thus, the present invention provides a means for moving some routing from the metallization/dielectric layer stack on top of the active region to the substrate below the active region. Thus, invention makes some use of some buried regions of the semiconductor substrate that would otherwise go unused. Preferably, the buried conductive lines of this invention are employed primarily for intracell routing in, for example, a gate array.

In one aspect, the present invention may be characterized as an integrated circuit including the following features: (1) multiple active devices (e.g., conventional MOS devices) provided in an active layer of a semiconductor substrate having a surface; and (2) a buried interconnect region providing a conductive pathway between at least two of the active devices. The buried interconnect region may itself be characterized as being (a) located within the semiconductor substrate beneath the surface of the semiconductor substrate and (b) having a conductivity that is greater than that of the semiconductor substrate.

In preferred embodiments, the integrated circuit also includes an insulating layer located beneath the surface of the semiconductor substrate and bounding the buried interconnect region to confine current between the active devices to the buried interconnect region. Using conventional SOI implant technology, the buried interconnect region and surrounding insulating layer may be provided at a depth of between about 1000 and 2000 Å beneath the semiconductor substrate surface.

In further preferred embodiments, the buried interconnect region includes a dopant which increases the conductivity of the semiconductor substrate. Such dopant is preferably a conductive metal such as aluminum or an aluminum alloy. However, it may also be a more conventional dopant such as phosphorus, arsenic, antimony, or boron.

Another aspect of the invention provides a process of forming a buried interconnect providing a conductive pathway between multiple active devices in an active layer of a semiconductor substrate. This process may be characterized as including the following steps: (1) masking regions of the wafer overlying regions outside of the location of the buried interconnect; (2) implanting a conductive dopant in the semiconductor substrate to provide the buried interconnect at a defined distance below the surface of the semiconductor substrate; and (3) forming the multiple active devices in the active layer of the semiconductor such that the buried interconnect electrically connects the multiple active devices. Preferably, though not necessarily, the process also includes a step of forming an insulating layer bounding the buried interconnect at about the defined distance below the surface of the semiconductor substrate. Often the step of forming an insulating layer will be performed prior to the step of implanting conductive dopant. In one example, the step of forming an insulating layer may include the following steps: (a) masking regions of the wafer overlying the location of the buried interconnect; and (b) implanting a insulating dopant (e.g., oxygen) in the semiconductor substrate which provides an insulating material in the semiconductor substrate.

During the process of forming an integrated circuit, active devices must be isolated from one another by an isolation process. In one preferred embodiment of this invention, the process of isolating active regions includes the following steps: (a) specifying the locations of the active regions in the active device layer; (b) masking the active regions with an oxygen ion impervious mask; and (c) implanting oxygen ions in the active device layer under conditions to form one or more isolation regions about the active regions in the active layer.

These and other features and advantages of the invention will be described in more detail below with reference to the drawings.

DETAILED DESCRIPTION OF THE PREFERRED EMBODIMENTS

The present invention provides a semiconductor substrate that includes a conductive region buried beneath the substrate surface and serving to interconnect electrically active devices (e.g., conventional Metal Oxide Semiconductor (MOS) transistor devices) or device elements. In the following description, numerous specific details are set forth in order to fully illustrate a preferred embodiment of the present invention. It will be apparent, however, that the present invention may be practiced without limitation to some specific details presented herein.

Figure 1A:
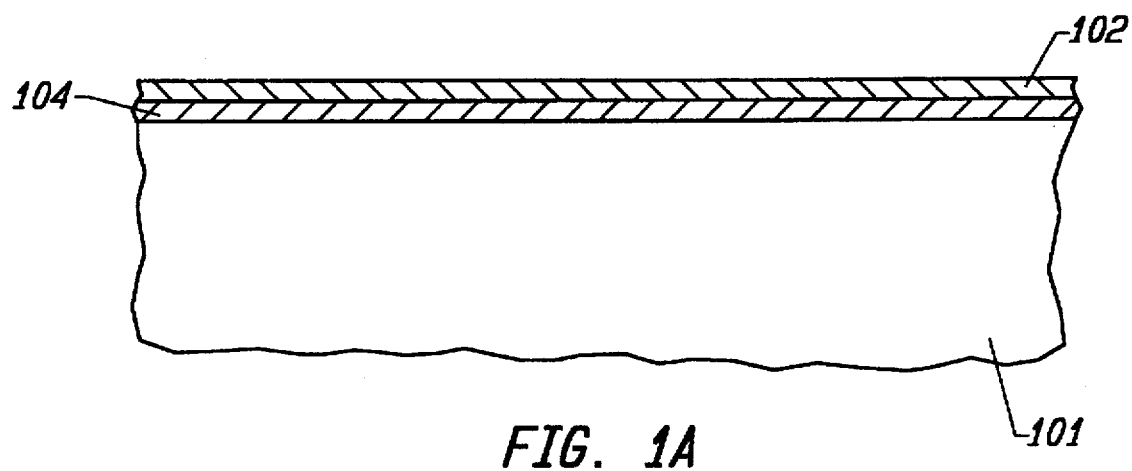
FIG. 1A shows a cross-sectional view of an IC substrate provided with an oxygen impervious mask layer and a passivation layer.

A process for fabricating an integrated circuit having a buried conductive region in accordance with a preferred embodiment of the present invention is illustrated in FIGS. 1A-1I. The process begins with a single crystal substrate 101 which may be a wafer of silicon or other semiconductor material. As shown in FIG. 1A, a passivation layer 104 is formed over the surface of substrate 101 by a conventional deposition or oxidation technique well known to those skilled in the integrated circuit fabrication art. Layer 104 may be silicon dioxide, silicon nitride, or other material suitable for protecting the substrate surface from ion implant damage.

On top of passivation layer 104, an oxygen impervious layer 102 is formed. Oxygen impervious layer 102 will serve as a mask during a subsequent oxygen ion implant that is conducted on substrate 101. Layer 102 may, therefore, generally include any appropriate masking material known to provide a sufficient barrier to energetic oxygen ions such that oxygen is kept out of the underlying surface of substrate 101. To a first order, the product of the density and thickness of layer 102 determines how well layer 102 will function as a mask. For further information on the ion penetration ranges inside various materials, reference may be made to the tables disclosed in Gibbons, Johnson, Mylroie, "Projected Range Statistics," second edition, Halstead Press, 1975, which is incorporated herein by reference for all purposes.

In one preferred embodiment of the present invention, layer 102 includes a photoresist material. As photoresist density is quite high (comparable to the density of silicon), a relatively thin layer of it effectively blocks oxygen ions from reaching the underlying surface of substrate 101.

It should be understood that passivation layer 104 is optional. It may be employed, for example, where necessary to protect substrate 101 from contact with and contamination by the overlying photoresist layer. Also, as noted, it may be employed to protect substrate 101 from excessive damage from ion implantation.

After the mask layer 102 is formed, it must be patterned to define the actual implantation mask. Preferably, though not necessarily, the mask is patterned by a photolithographic technique in which radiation is projected through a reticle containing opaque regions casting shadows on layer 102 at locations corresponding to the mask layout. The mask is formed by contacting the exposed mask layer 102 to a developing solution which removes either the exposed or unexposed regions, depending upon whether a positive or negative photoresist is used. The resulting mask will define the location of an insulating region outside of a buried conductive region (to be formed later) in the substrate 101.

Figure 1B:
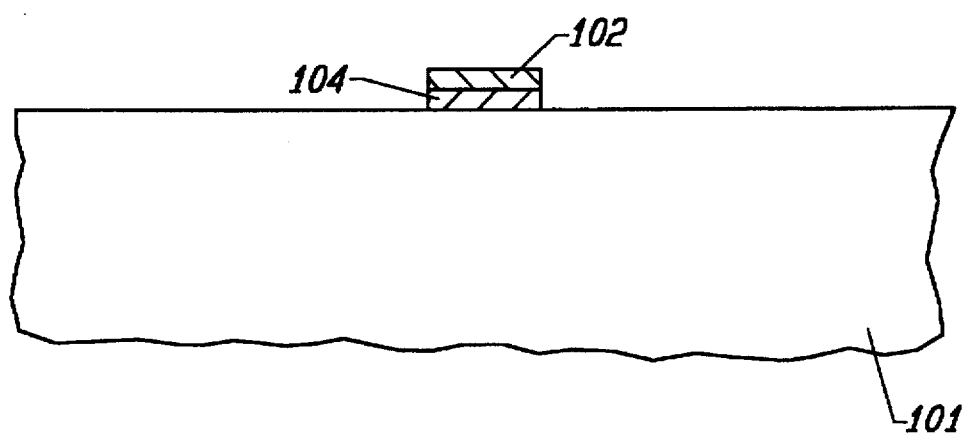
FIG. 1B shows a cross-sectional view of the substrate that results after etching away portions of the mask layer shown in FIG. 1A to produce a mask in the regions that overly a buried conductive region to be formed in subsequent steps.
Figure 2A:
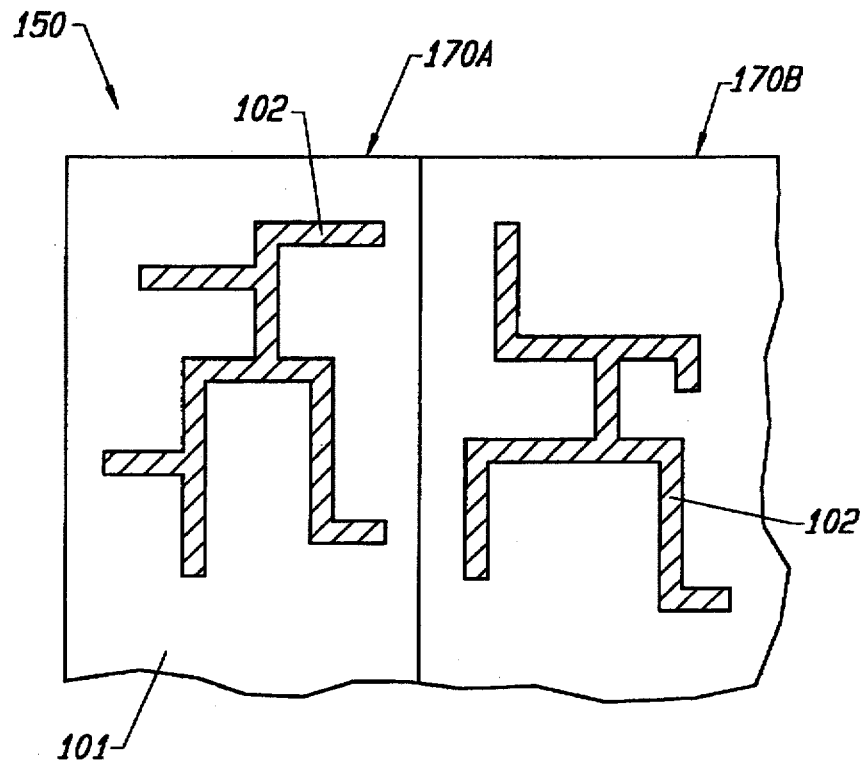
FIG. 2A shows the top view of a selected portion of a mask used in FIG. 1B in one embodiment of the present invention.

As shown in FIG. 1B, portions of passivation layer 104 and oxygen impervious layer 102 are stripped or etched away by a mask definition procedure such as the above-described photolithographic technique to form a mask over those areas of the substrate surface that overly the buried conductive region (to be formed later). FIG. 2A provides a top view of a hypothetical mask corresponding to layer 102 as it is depicted in side view in FIG. 1B. In the example shown in FIG. 2A, a segment of a gate array 150 includes base cells 170a and 170b. The base cells each have defined thereon a mask (remnants of layer 102) for connecting individual devices within the base cells to one another. In the embodiment shown, intracell routing is defined by the mask. Of course, other masks may define intercell routing for the buried conductive region. Further, other masks may be provided on cell base designs or other non-gate array ICs.

Figure 1C:
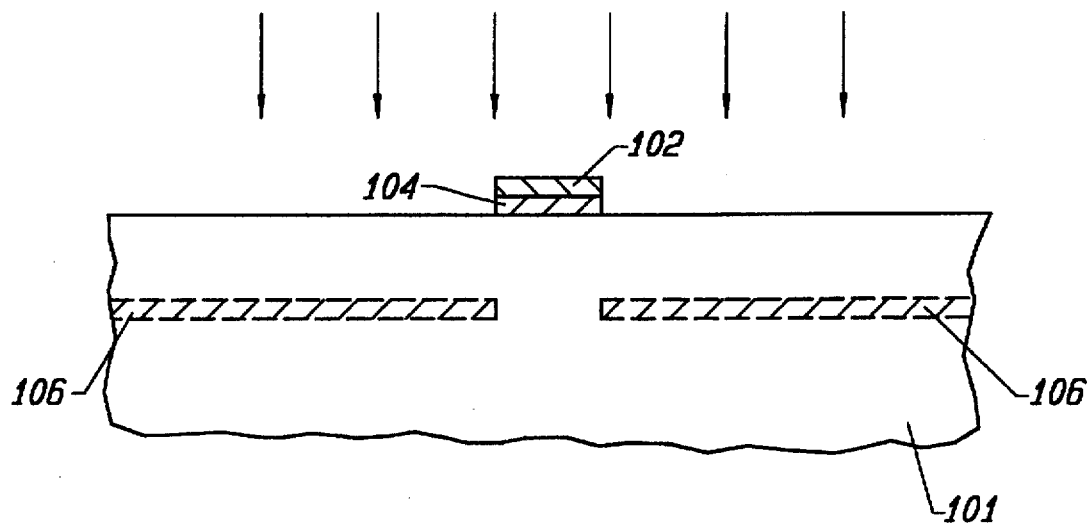
FIG. 1C shows a cross-sectional view of the substrate during an oxygen ion implant over the substrate as shown in FIG. 1B to produce a buried insulating region.

As shown in FIG. 1C, an oxygen ion implant of defined energy and dosage is conducted over the substrate surface to penetrate the unmasked portions of substrate 101 and form an insulating layer 106. Insulating layer 106 should be resistive enough to effectively insulate the contemplated buried conductive region from the nearby conductive regions to prevent shorting. In one embodiment of the present invention, the oxygen ion implant may be performed under conditions conventionally employed to form insulating layers in SOI devices.

In a preferred embodiment, the oxygen ion implant may be conducted generally at an energy that is between about 20 and 300 KeV. It is, however, preferable to conduct the implant at an energy that is between about 30 and 150 KeV and more preferable to conduct the implant an energy that is between about 30 and 100 KeV. Additionally, the oxygen implant may be generally conducted at a dose of between about $1 \times 10^{16}$ and about $1 \times 10^{18}$ cm$^{-2}$. It is, however, preferable to conduct the implant at a dose that is between about $5 \times 10^{16}$ and about $5 \times 10^{17}$ cm$^{-2}$ and more preferable to conduct the implant at a dose that is between about $7.5 \times 10^{16}$ and about $1.25 \times 10^{17}$ cm$^{-2}$. The insulation layer depth must provide sufficient space to allow formation of active MOS transistor devices. In one specific example, the insulation layer is provide about 1000 to about 2000 Angstroms (Å) below the substrate surface.

Figure 1D:
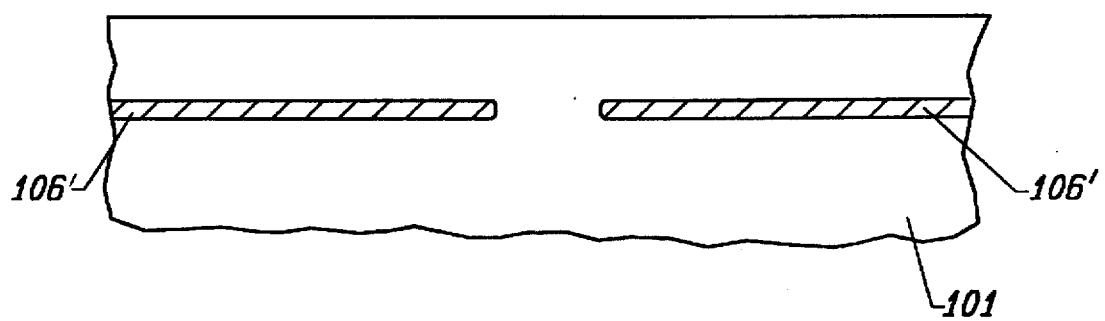
FIG. 1D shows a cross-sectional view of the substrate that results after activating the substrate to produce an activated insulating region and removing the mask shown in FIG. 1C.

Now referring to FIG. 1D, layers 102 and 104 which were present during the oxygen implant step are removed from the substrate surface using conventional techniques such as ashing or wet etching. Next, insulating layer 106 is activated by a thermal excitation process such as rapid thermal processing (RTP) or furnace annealing, both of which are well known in the art. During the activation process, the substrate surface undergoes low temperature activation for a short period of time to form an activated insulating layer 106'.

During the activation step, most of the oxygen ions in oxygen ion implant region 106 (as shown in FIG. 1B) react with the silicon present in substrate 101 to produce SiO$_x$, where x ranges between about 0 and about 2 depending on the local concentration of the reactant oxygen ions. The concentration of reactant oxygen ions may vary across the depth of oxygen ion implant region 106. As a result, the stoichiometry of SiO$_x$ may vary with depth (the direction normal to the surface of substrate 101) across layer 106' accordingly. The value of x in SiO$_x$ is dictated primarily by (1) the dose of oxygen ions provided during the implant, and (2) the distance from the peak oxygen concentration.

It should be understood that while the activation step has been described above as being conducted after the implant step, this is not necessary. If fact, it may sometimes be preferable to perform the activation step later in the process as part of another anneal process. Such other anneal processes may include the annealing step conventionally performed after source and drain regions have been implanted. As activation usually requires less energy than such annealing, the activation will take place automatically during the anneal step. In this manner, two desired results (source/drain annealing and oxygen implant activation) can take place in a single process step. Thus, the total heating time employed during IC fabrication can be minimized to reduce the deleterious effects of impurity redistribution.

Figure 1E:
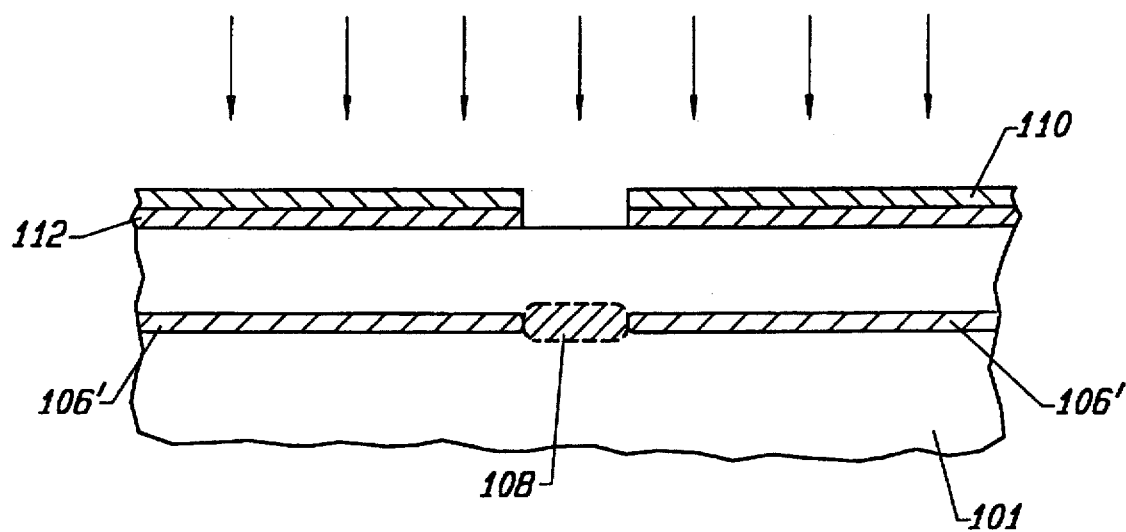
FIG. 1E shows a cross-sectional view of the substrate during an oxygen ion implant to produce a buried conductive region after masking off portions of the substrate surface that overly the previously formed buried insulating layer as shown in FIG. 1D.
Figure 2B:
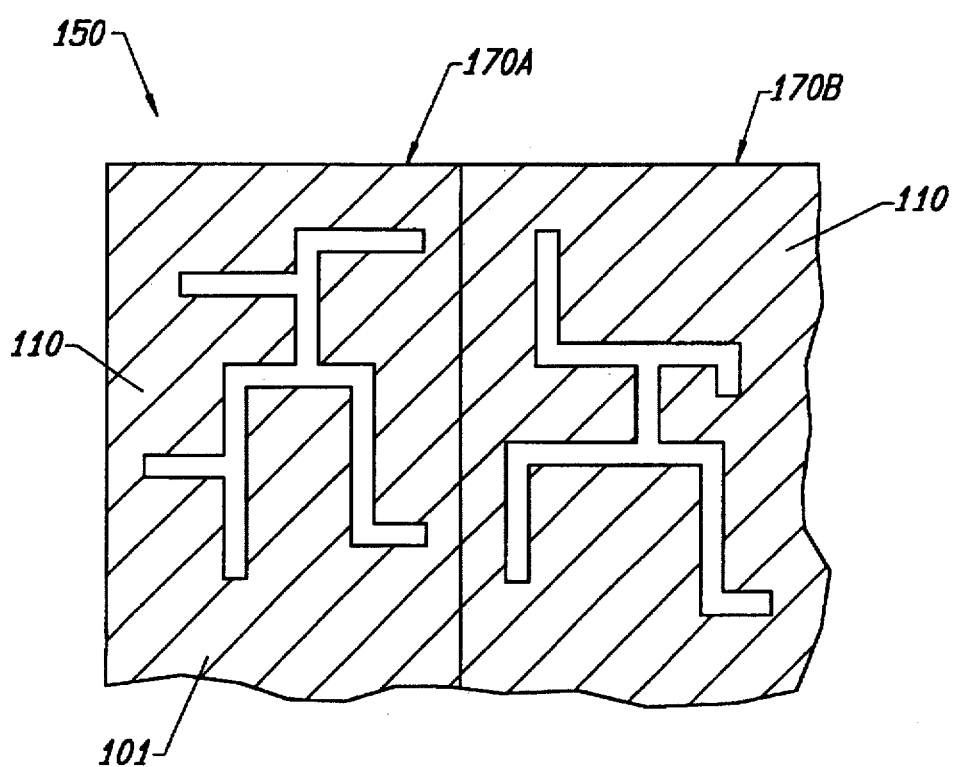
FIG. 2B shows the top view of a selected portion of a mask used in FIG. 1E in one embodiment of the present invention.

After forming insulating region 106', regardless of activation, the substrate 101 is prepared for a conductive ion implant. As shown in FIG. 1E, masks which include an oxygen impervious layer 110 and a passivation layer 112 that may be similar in composition to layers 102 and 104 shown in FIG. 1B are formed on portions of the substrate surface (by for example photolithography) such that regions overlying the specified buried conductive region are exposed during a conductive ion implant. FIG. 2B presents a top view of a hypothetical mask for the conductive ion implant. As shown, the mask is a mirror image of the mask shown in FIG. 2A. The mask shown in FIG. 2B is used to form conductive buried interconnects, while the mask shown in FIG. 2A is used to form an insulating layer confining the conductive buried interconnects. Each of these masks define the layout of the buried interconnects of the present invention. Often the masks will resemble those used to pattern metallization layers in comparable integrated circuits that do not employ the buffed interconnects of this invention.

As shown in FIG. 1E, a conductive ion implant is performed while mask layer 110 is present. The function of the conductive ion implant is to implant ions which increase the conductivity of the buried interconnect regions. At a minimum, the implant should create a conductive path having a conductivity greater than that of the bulk semiconductor substrate. Thus, the implanted material is preferably a conductive metal.

A high dose implant of conventional n or p-type dopants (e.g., arsenic, antimony, phosphorous, boron, etc.) will also significantly increase the conductivity of the buried interconnect regions. However, if the buried interconnect region connects to a device element having a conductivity type different from that of the interconnect itself, a junction potential will be built into the connection. For example, if a p-doped buffed interconnect region contacts an n-doped source/drain region, then a junction potential will exist at the contact. Of course, this will not be an issue if the same conductivity types are employed for the interconnect and the connected device elements. Thus, it may sometimes be desirable to perform the conductive ion implant in two steps: an n-type implant conducted over a mask of certain buffed interconnect regions and a p-type implant conducted over a mask of other buried interconnect regions.

In a preferred embodiment, aluminum or an aluminum alloy is implanted to form the buried interconnect regions. Those of skill in the art will recognize that various alternative highly conductive materials may be substituted for aluminum or aluminum alloy.

The conductive ion implant is conducted over the substrate surface at an energy and dosage that is sufficient to form a buried conductive region 108 at about the same level as the insulating layer and within the unimplanted regions defined within insulating layer 106. Thus, the conductive material preferably will be implanted at a depth of between about 1000 and 2000 Å beneath the substrate surface. The conditions under which conventional n- and p-type dopants (e.g., phosphorus, arsenic, antimony, boron, etc.) can be implanted to the appropriate depth are well known. Aluminum and other conductive materials can be deposited to comparable depths by conventional ion implantation techniques accounting for the atomic weight, density, and other physical properties of the implanted material vis-a-vis the substrate.

Figure 1F:
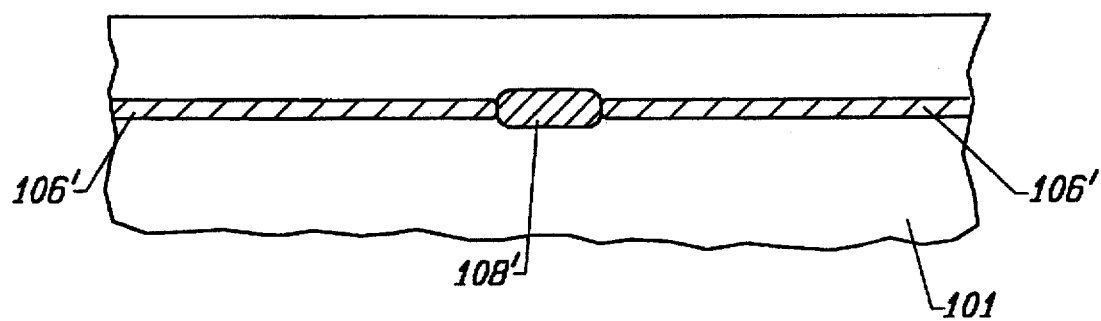
FIG. 1F shows a cross-sectional view of the substrate that results after the buried conductive region as shown in FIG. 1E is activated to produce an activated buried conductive region.

Now referring to FIG. 1F, layers 110 and 112 which served as masks are removed from the substrate surface using conventional techniques discussed above. At this point, the substrate surface may undergo annealing to form a buried conductive region 108'.

Next, the device active regions are isolated from one another. While various well-known isolation techniques may be employed (including field oxide isolation and trench isolation), the embodiment illustrated in FIG. 1G employs an oxygen implant. Initially, the substrate 101 is prepared for the oxygen ion implant by providing a passivation layer 116 and an oxygen impervious layer 117 on the surface of substrate 101. Layer 117 is then converted to a mask by, for example, conventional photolithographic techniques as discussed above. The resulting mask protects underlying active regions 144 against a subsequent oxygen ion implant. As shown, the oxygen ion implant is performed over the substrate surface with a sufficient dose and energy to form isolation regions 118.

Figure 1G:
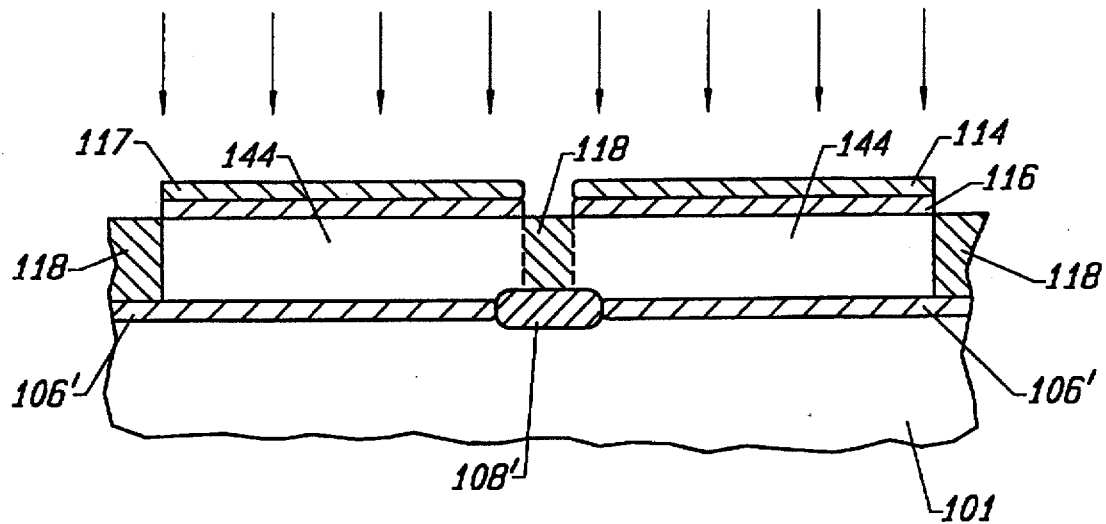
FIG. 1G shows a cross-sectional view of the substrate during an oxygen ion implant to produce isolation regions that effectively isolate the active regions after masking off portions of the substrate surface that overly the electrically active regions and then.

For the step shown in FIG. 1G, the oxygen ion implant may be conducted generally at an energy tailored to deposit a relatively high concentration of oxygen within isolation region 118. In a preferred embodiment, the implant energy is between about 10 KeV and between about 300 KeV. Additionally, the oxygen implant may be generally conducted at a dose of between about $1 \times 10^{16}$ and about $1 \times 10^{18}$ cm$^{-2}$.

The implanting step employed to form the isolation regions preferably generates oxygen atoms in a peak concentration of between about $1 \times 10^{20}$ atoms/cm$^3$ and $5 \times 10^{22}$ atoms/cm$^3$ within the one or more isolation regions. The oxygen ion peak concentration region may be located proximate the vertical center of the one or more isolation regions. In a preferred embodiment the isolation region is formed with a single implant step. In alternative embodiments, the isolation region is formed by multiple implant steps, each conducted under conditions providing a unique vertical position for a peak oxygen concentration, such that the one or more isolation regions have multiple oxygen ion concentration peaks.

Figure 1H:
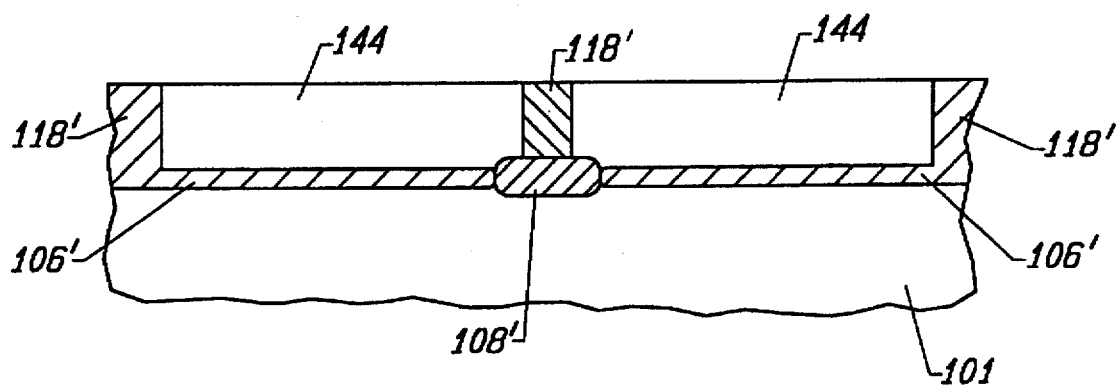
FIG. 1H shows a cross-sectional view of the substrate that results after the isolation regions as shown in FIG. 1G are activated to produce activated isolation regions which define active device regions on the substrate.

As shown in FIG. 1H, passivation layer 116 and photoresist layer 117 may be removed by a process such as ashing. Thereafter, a low temperature activation step may be conducted for a short duration to form an activated isolation region 118', similar to the activation step discussed in reference to FIG. 1D. As with the process of forming the insulating layer, such activation may performed as a separate step or it may be delayed so that it occurs during a subsequent heat treatment step conducted for another purpose in the manufacturing process. During annealing most of the oxygen ions in isolation regions 118 react with the silicon present in substrate 101 to produce SiO$_x$, where x ranges between about 0 to 2, depending on the concentration of the reactant oxygen ions. Isolation regions 118' therefore consist primarily of SiO$_x$ and effectively electrically insulate or isolate active regions 144. The characteristics and formation of isolation regions are also discussed in a pending patent application Ser. No. 08/710,782, naming Schinella and Padmanabhan as inventors, and filed on the same day as the present application. That application is incorporated herein by reference for all purposes.

Figure 1I:
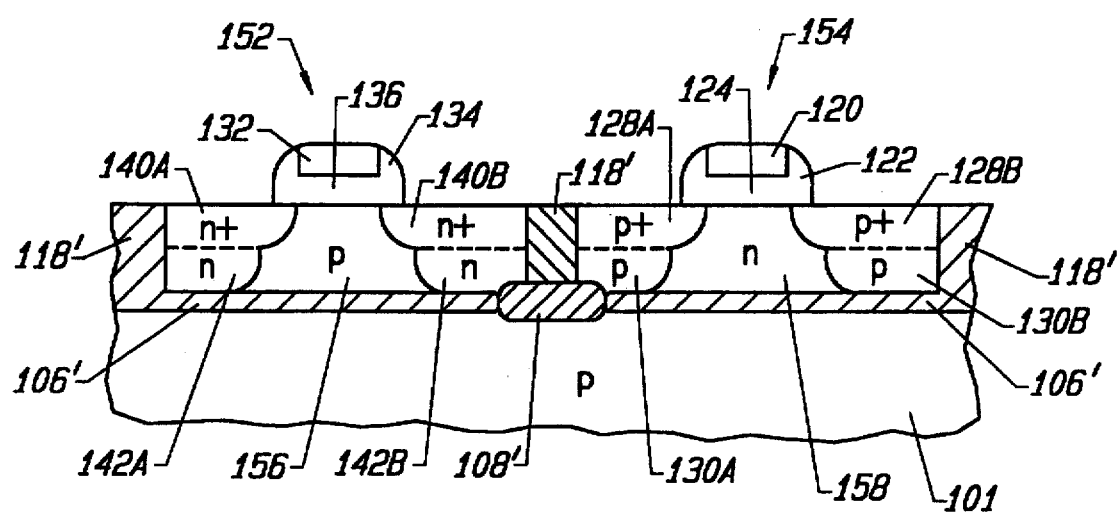
FIG. 1I shows a cross-sectional view of the substrate that results after forming conventional Metal Oxide Semiconductor (MOS) devices in the active device regions as shown in FIG. 1H.

The process described so far has illustrated the front end process steps of forming (1) an insulating layer 106' located immediately below an active device layer, (2) a conductive interconnect region 108' located at the same level as insulating layer 106', and (3) one or more isolation regions 118'. Together, these structures define the bounds of active regions 144 which house devices of an integrated circuit. Such devices are shown in FIG. 1I as including an NMOS device 152 formed in one active region and a PMOS device 154 formed in a second active region.

To form NMOS device 152 and PMOS device 154, various additional front end process steps must be performed. In the example illustrated, the substrate 101 is assumed to be doped p-type, so there is no need to form a separate well in the NMOS device 152. It should be understood that a local region of p-type doping serves as a well 156 for NMOS device 152. However, a separate n-type implant step is required to form a well 158 shown in PMOS device 154. This implant is performed by masking NMOS device region 152 while implanting phosphorus or arsenic ions, for example, in a dose and energy sufficient to form well region 158. Note that the well implant may be conducted before or after the isolation regions 118' have been formed.

Sometime after the well region 158 is formed, a gate oxide layer is formed on the substrate, and then a polysilicon layer is formed on the gate oxide layer (typically by CVD deposition). The resulting polysilicon layer may be doped by ion implantation, masked, and etched to form gate electrodes 132 and 120. Gate oxides 136 and 124 from the gate oxide layer remain under gate electrodes 132 and 120, respectively.

After the gates have been formed, source/drain regions are formed by two or more ion implantation steps. Initially, two Lightly Doped Drain (LDD) implants are performed. These will form n-type source/drain regions 142A and 142B of NMOS device 152 and p-type source/drain regions 130A and 130B of PMOS device 154. Typically, the NMOS transistor regions will be masked during the p-type implant and the PMOS transistor regions will be masked during the n-type implant. In this manner, the p- and n-type transistor groups are formed separately in the active layer.

The source/drain regions are completed after forming spacers 134 adjacent gate electrode 132 and spacers 122 adjacent gate electrode 120. The spacers may be formed by depositing a blanket layer of oxide on the wafer surface and then performing an anisotropic etch. After the spacers have been formed, an n-type implant is performed to form heavily doped source/drain regions 140A and 140B in NMOS device 152, and a p-type implant is performed to form heavily doped source/drain regions 128A and 128B in PMOS device 154.

After the source/drain regions have been formed, a silicide (not shown) may formed on top of the polysilicon and substrate to create less resistive regions. Finally a passivation layer of, e.g., borophosphosilicate glass ("BPSG") is deposited over the entire structure. At this point, the front end processing is complete.

Typical back end process steps will now be described. Initially, a contact mask is formed on the passivation layer to define buried conductive region to device elements on the substrate and to the associated polysilicon gate electrodes. Thereafter, the passivation region is etched (typically by a plasma etch) to form vertical contact holes through the passivation layer to level 1 (the underlying substrate and polysilicon). At this point, a diffusion barrier layer (sometimes referred to as a "glue" layer) made of a material such as a titanium nitride layer is formed to protect the device elements adjacent the contact holes from ingress of metal atoms from a subsequently deposited metallization layer. In some processes, the contact holes are filled with tungsten plugs according to procedures known in the art. Regardless of whether tungsten plugs are formed, a blanket deposition of a first metallization layer is performed. The first (and all subsequent) metallization layers may be made from various metals used in the industry such as aluminum (Al), aluminum copper (AlCu), or aluminum silicon copper (AlSiCu). These layers are conventionally deposited by sputtering, as is well known in the industry.

After the first metallization layer has been deposited, it is patterned to form lines connecting various device elements. The exact layout of the lines will be determined by the particular IC or ASIC design. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and a dielectric layer is deposited over the first metallization layer in order to insulate this metallization layer from the next successive metallization layer (i.e., the second metallization layer). Typically, oxide or borophosphosilicate glass is used as the dielectric layer, but other dielectrics such as a nitride or polyimide films (which can be laid on by spinning) may also be used. The dielectric layer is then planarized by any appropriate technique. After a dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. After the formation of the vias in the dielectric, the next metallization layer (metal-2) is deposited and patterned as described above. In some cases, it may be necessary to form and pattern one or more additional metallization layers to complete the wiring of the IC.

In some cases, it may be necessary to form and pattern one or more additional metallization layers to complete the wiring of the gate array IC. However, because at least some of the interconnections will be completed at the substrate level, the total number of metallization layers may be less than normally expected as a direct result of practicing this invention. In one embodiment, the substrate level routing accomplishes some or all of the intracell routing in a gate array. In another embodiment, the substrate level routing accomplishes at least some intercell routing.

Although the foregoing invention has been described in some detail for purposes of clarity of understanding, it will be apparent that certain changes and modifications may be practiced within the scope of the appended claims. For example, while the implants employed to form the insulating layer have been described as being oxygen ion implants, there is in principal no reason why the implant could not be conducted with another ion, such as nitrogen or certain fluorine bearing ions, that also forms an insulating layer. Further, while the use of implants to form the buried interconnects and insulating layer has been described, other processes could be employed to form these features. For example, the buried interconnect could be formed by etching an interconnect trench pattern in a substrate or oxide layer on the substrate, filling the trench pattern with a conductive material, and providing a semiconductor device layer on top of the filled trench pattern. The final step might be accomplished by bonding an active device layer to a bulk semiconductor layer having the filled interconnect trench pattern. Still further, while the process has been described with a goal of forming silicon based CMOS circuits, the general principles of the process could be employed in non-silicon based semiconductor systems. Therefore, the present embodiments are to be considered as illustrative and not restrictive, and the invention is not to be limited to the details given herein, but may be modified within the scope of the appended claims.

What is claimed is:

1. A process of forming a buried interconnect providing a conductive pathway between multiple active devices provided in an active layer of a semiconductor substrate having a surface, the buried interconnect being located beneath the surface of said semiconductor substrate, the process comprising the following steps:

masking regions of said semiconductor substrate overlying regions outside of the location of said buried interconnect;

implanting a conductive dopant including aluminum in said semiconductor substrate to provide said buried interconnect at a defined distance below the surface of said semiconductor substrate;

forming said multiple active devices in said active layer of the semiconductor such that the buried interconnect electrically connects the multiple active devices; and forming an insulating layer at about said defined distance below the surface of said semiconductor substrate wherein said insulating layer bounds said buried interconnect thereby confining current between said multiple active devices to the buried interconnect.

2. The process of claim 1, wherein the step of forming the insulating layer is performed prior to said step of implanting conductive dopant.

3. The process of claim 1, wherein the step of forming the insulating layer includes the following steps:

masking regions of said wafer overlying the location of said buried interconnect; and implanting an insulating dopant in said semiconductor substrate which provides an insulating material in said semiconductor substrate.

4. The process of claim 3, wherein the insulating dopant is oxygen.

5. The process of claim 1, further comprising a step of isolating active regions in the active layer of the semiconductor substrate.

6. The process of claim 5, wherein said step of isolating active regions includes the following steps:

specifying the locations of said active regions in said active device layer;

masking said active regions with an oxygen ion impervious mask; and implanting oxygen ions in said active device layer under conditions to form one or more isolation regions about said active regions in said active layer.

7. The process of claim 1, wherein said step of implanting the conductive dopant is performed under conditions whereby said defined distance is between about 1000 and about 2000 Ångstroms.

8. The process of claim 1, wherein the conductive dopant comprises an aluminum alloy.

9. The process of claim 1, further comprising annealing the semiconductor substrate to provide an annealed buried interconnect region.

10. The process of claim 3, wherein the insulating dopant is at least one of nitrogen or fluorine containing material.

11. The process of claim 3, further comprising activating the insulating dopant by rapid thermal processing.

12. The process of claim 6, wherein the step of implanting oxygen ions is conducted at an implant energy that is between about 10 KeV and about 300 KeV.

13. The process of claim 6, wherein the step of implanting oxygen ions is conducted at a dose of between about $1 \times 10^{16}$ and about $1 \times 10^{18}$ cm$^{-2}$.

14. The process of claim 6, wherein the step of implanting oxygen ions generates oxygen atoms in a peak concentration of between about $1 \times 10^{20}$ and about $5 \times 10^{20}$ atoms/cm$^3$ in one or more isolation regions.

15. The process of claim 14, wherein the peak concentration is located proximate the vertical center of the one or more isolation regions.

16. The process of claim 6, wherein the step of implanting oxygen ions comprises performing multiple oxygen ion implants such that each implant produces a unique vertical position for peak oxygen concentration and the one or more isolation regions have multiple oxygen ion concentration peaks.

* * * * *